(12) United States Patent
Shimoi et al.

(10) Patent No.: US 8,961,806 B2
(45) Date of Patent: Feb. 24, 2015

(54) LASER PROCESSING METHOD

(75) Inventors: Hideki Shimoi, Hamamatsu (JP);
Hiroyuki Kyushima, Hamamatsu (JP);
Keisuke Araki, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 57 days.

(21) Appl. No.: 13/388,597

(22) PCT Filed: Jul. 19, 2011

(86) PCT No.: PCT/JP2011/066351
§ 371 (c)(1),
(2), (4) Date: Feb. 2, 2012

(87) PCT Pub. No.: WO2012/014720
PCT Pub. Date: Feb. 2, 2012

(65) Prior Publication Data
US 2012/0125893 A1    May 24, 2012

(30) Foreign Application Priority Data

Jul. 26, 2010 (JP) ................................ 2010-167427

(51) Int. Cl.
| | |
|---|---|
| B44C 1/22 | (2006.01) |
| H01L 21/306 | (2006.01) |
| B23K 26/00 | (2014.01) |
| B23K 26/06 | (2014.01) |
| B23K 26/08 | (2014.01) |

(52) U.S. Cl.
CPC ......... *B23K 26/0042* (2013.01); *B23K 26/0057* (2013.01); *B23K 26/063* (2013.01); *B23K 26/0853* (2013.01); *B23K 2201/40* (2013.01)

USPC .......................................................... 216/87

(58) Field of Classification Search
None
See application file for complete search history.

(56) References Cited

U.S. PATENT DOCUMENTS 3,662,178 A * 5/1972 Caputi et al. ............... 250/472.1
3,713,921 A * 1/1973 Fleischer et al. ................ 216/87
(Continued)

FOREIGN PATENT DOCUMENTS

| CN | 1294540 A | 5/2001 |
|---|---|---|
| EP | 1 061 578 A1 | 12/2000 |

(Continued)

OTHER PUBLICATIONS

Mitsuru Watanabe et al., "Femtosecond laser-assisted three-dimensional microfabrication in silica", Optics Letters, Mar. 1, 2001, vol. 26, No. 5, pp. 277-279.

*Primary Examiner* — Allan Olsen
(74) *Attorney, Agent, or Firm* — Drinker Biddle & Reath LLP

(57) ABSTRACT

In a method comprising a modified region forming step of converging a laser light at a sheet-like object to be processed made of silicon so as to form a plurality of modified spots within the object along a modified region forming line tilted in a first lateral direction with respect to a thickness direction of the object and the plurality of modified spots construct a modified region, and an etching step of anisotropically etching the object after the modified region forming step so as to advance the etching selectively along the modified region and form the object with a space extending obliquely with respect to the thickness direction, the modified region forming step forms the plurality of modified spots such that the modified spots adjacent to each other at least partly overlap each other when seen in the first lateral direction.

9 Claims, 12 Drawing Sheets

(56) References Cited

U.S. PATENT DOCUMENTS

| | | | |
|---|---|---|---|
| 3,770,532 A * | 11/1973 | Bean et al. ............... 216/56 |
| 3,802,972 A * | 4/1974 | Fleischer et al. ............ 216/57 |
| 6,033,583 A * | 3/2000 | Musket et al. ............... 216/56 |
| 6,992,026 B2 | 1/2006 | Fukuyo et al. |
| 7,033,519 B2 | 4/2006 | Taylor et al. |
| 2003/0007772 A1* | 1/2003 | Borrelli et al. ............ 385/137 |
| 2005/0272223 A1 | 12/2005 | Fujii et al. |
| 2009/0065481 A1 | 3/2009 | Kishimoto et al. |
| 2010/0136766 A1 | 6/2010 | Sakamoto et al. |
| 2012/0103679 A1* | 5/2012 | Yamamoto et al. ........ 174/264 |
| 2012/0261177 A1* | 10/2012 | Yamamoto et al. ........ 174/262 |
| 2013/0143381 A1* | 6/2013 | Kikukawa ............... 438/381 |

FOREIGN PATENT DOCUMENTS

| | | |
|---|---|---|
| JP | 4-150212 | 5/1992 |
| JP | 7-40482 | 5/1995 |
| JP | 10-202878 | 8/1998 |
| JP | 2873937 | 1/1999 |
| JP | 2000-246475 | 9/2000 |
| JP | 2002-210730 | 7/2002 |
| JP | 2004-128445 | 4/2004 |
| JP | 2004-136358 | 5/2004 |
| JP | 2004-160618 | 6/2004 |
| JP | 2004-223586 | 8/2004 |
| JP | 2004-304130 | 10/2004 |
| JP | 2004-351494 | 12/2004 |
| JP | 2004-359475 | 12/2004 |
| JP | 2005-1211 | 1/2005 |
| JP | 2005-74663 | 3/2005 |
| JP | 2005-121915 | 5/2005 |
| JP | 2005-121916 | 5/2005 |
| JP | 2005-144586 | 6/2005 |
| JP | 2005-144622 | 6/2005 |
| JP | 2005-152693 | 6/2005 |
| JP | 2005-169993 | 6/2005 |
| JP | 2005-206401 | 8/2005 |
| JP | 2005-208175 | 8/2005 |
| JP | 2005-306702 | 11/2005 |
| JP | 2005-351774 | 12/2005 |
| JP | 2006-167804 | 6/2006 |
| JP | 2006-176355 | 7/2006 |
| JP | 2006-290630 | 10/2006 |
| JP | 2006-352171 | 12/2006 |
| JP | 2007-36758 | 2/2007 |
| JP | 2007-101833 | 4/2007 |
| JP | 2010-142837 | 7/2010 |
| JP | 2010-155259 | 7/2010 |
| WO | 00/50198 | 8/2000 |

* cited by examiner

Fig.7
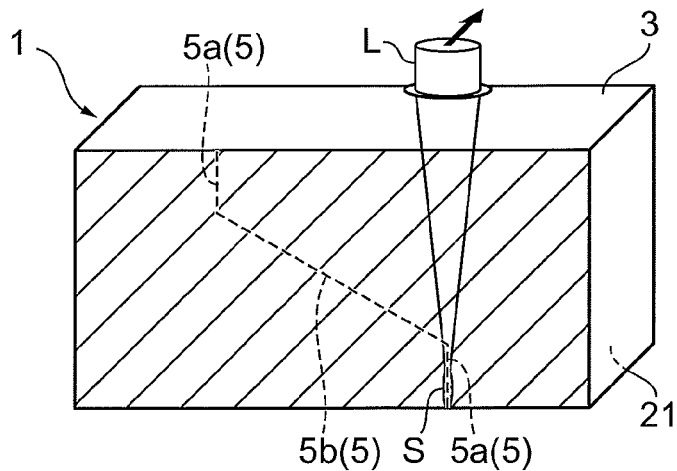
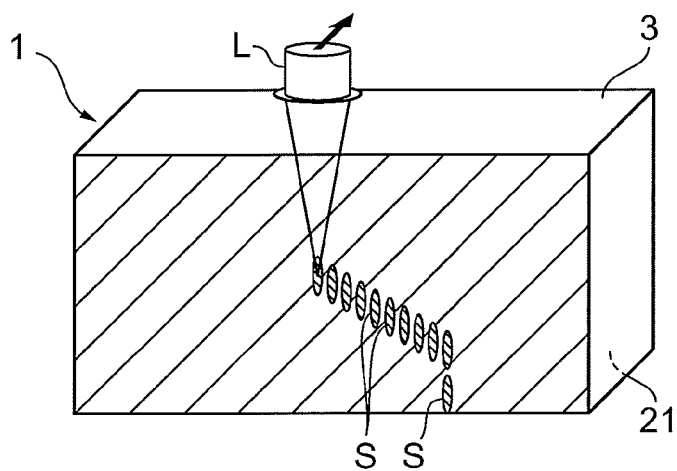
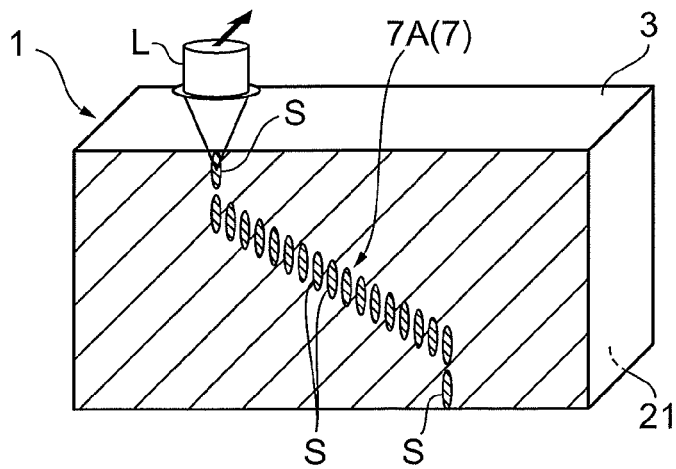

Fig.8
(a)
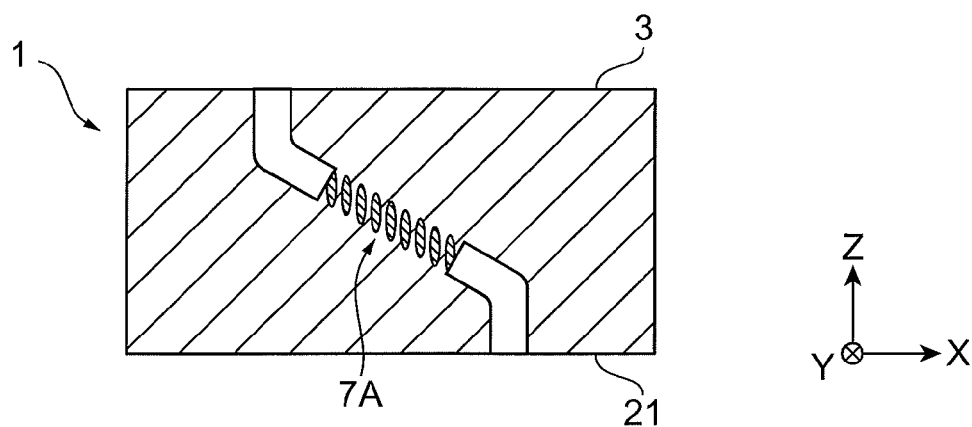
(b)
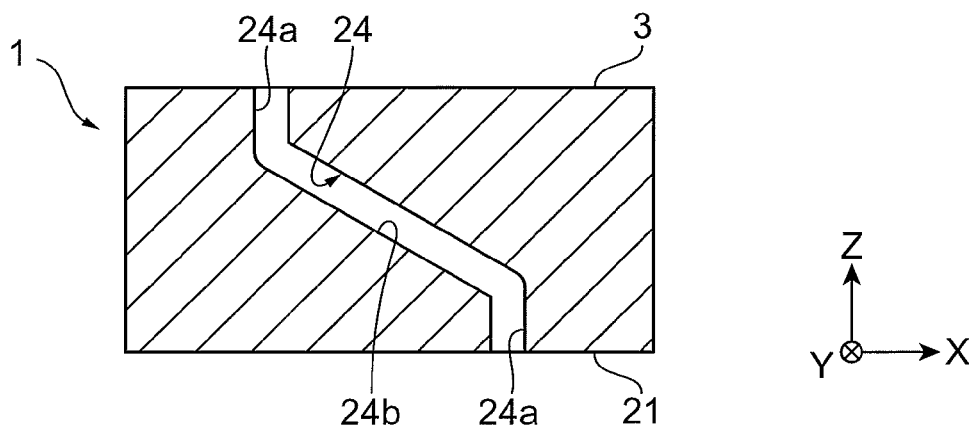

*Fig.9*
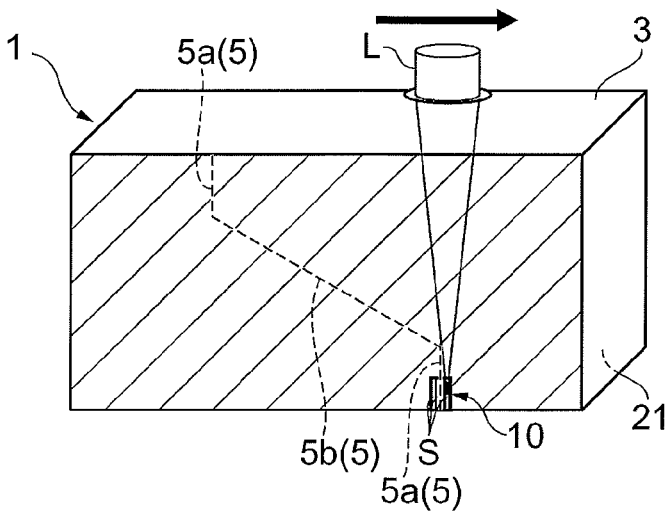
(a)
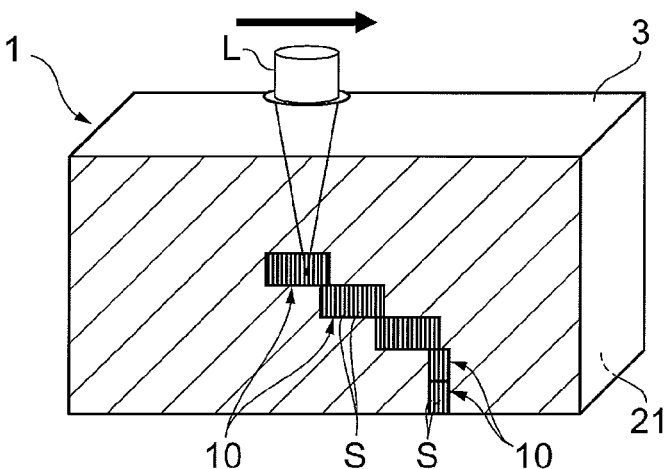
(b)
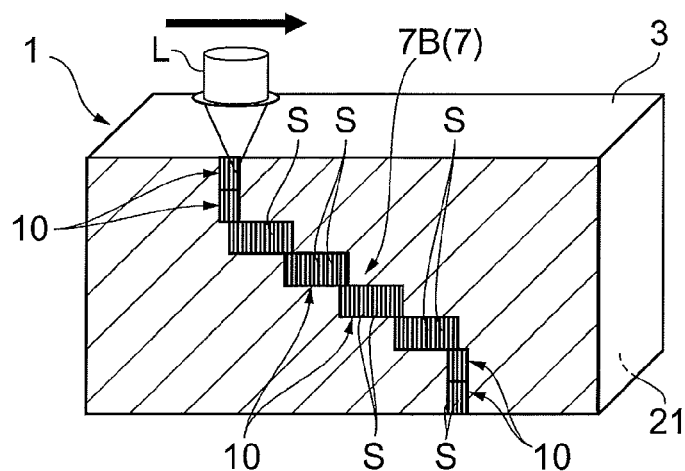
(c)

LASER PROCESSING METHOD

TECHNICAL FIELD

The present invention relates to a laser processing method.

BACKGROUND ART

Known as an example of conventional laser processing methods is one comprising converging a laser light at a silicon monocrystal substrate (object) so as to form a material modified part (modified region) and then etching the silicon monocrystal substrate so as to remove the material modified part, thereby forming a blind hole or through hole in the silicon monocrystal substrate as disclosed in Patent Literature 1.

CITATION LIST

Patent Literature

Patent Literature 1: Japanese Patent Application Laid-Open No. 2005-74663

SUMMARY OF INVENTION

Technical Problem

While the above-mentioned laser processing methods have been advancing their application to various fields, those which can accurately form a object to be processed with a space such as a hole extending in a direction tilted with respect to the thickness direction of the object (which may simply be referred to as "tilted direction" hereinafter) have been in demand in order to improve the degree of freedom in designing, for example.

It is therefore an object of the present invention to provide a laser processing method which can accurately form an object to be processed with a space (hole) extending in a direction tilted with respect to the thickness direction of the object.

Solution to Problem

For achieving the above-mentioned object, the laser processing method in accordance with one aspect of the present invention comprises a modified region forming step of converging a laser light at a sheet-like object to be processed made of silicon so as to form a plurality of modified spots within the object along a modified region forming line tilted in a first lateral direction with respect to a thickness direction of the object and the plurality of modified spots construct a modified region, and an etching step of anisotropically etching the object after the modified region forming step so as to advance the etching selectively along the modified region and form the object with a space extending obliquely with respect to the thickness direction, wherein the modified region forming step forms the plurality of modified spots such that the modified spots adjacent to each other at least partly overlap each other when seen in the first lateral direction.

This laser processing method performs anisotropic etching and thus can control the advancement of etching by utilizing the characteristic feature that the etching rate depends on the crystal orientation of the object. Since the modified spots adjacent to each other at least partly overlap each other when seen in the first lateral direction in the modified region, a plurality of modified spots or fractures extending therefrom can favorably be joined to each other. Therefore, the selective etching of the modified region can favorably be advanced without interruption even when proceeding along a direction tilted with respect to the thickness direction. This can accurately remove the part corresponding to the space in the object, whereby the space can be formed precisely in the object.

For favorably achieving the operation and effect mentioned above, the modified region forming step may specifically comprise a step of forming a plurality of modified spots along the line while shifting the modified spots in the thickness direction such that the modified spots adjacent to each other partly overlap each other when seen in the first lateral direction. Here, there is a case where the modified region forming step irradiates the object with the laser light while moving a converging point of the laser light along a second lateral direction orthogonal to the first lateral direction.

For favorably achieving the operation and effect mentioned above, the modified region forming step may specifically comprise a step of forming a plurality of modified spot groups, each including two or more modified spots continuously aligning along the first lateral direction, along the line while shifting the modified spot groups in the first lateral direction such that a pair of modified spot groups adjacent to each other partly overlap each other when seen in the thickness direction. Here, there is a case where the modified region forming step irradiates the object with the laser light while moving the converging point of the laser light along the first lateral direction.

The modified region forming step may comprise a first step of forming a plurality of modified spots along the line while shifting the modified spots in the thickness direction such that the modified spots adjacent to each other partly overlap each other when seen in the first lateral direction and a second step of forming a plurality of modified spot groups, each including two or more modified spots continuously aligning along the first lateral direction, along the line while shifting the modified spot groups in the first lateral direction such that a pair of modified spot groups adjacent to each other partly overlap each other when seen in the thickness direction. In this case, appropriately performing the first and second steps in the modified region forming step can control the advancement of etching in the etching step, so as to adjust the size of the resulting hole. This is because a characteristic feature is found in that the etching along the modified region formed by the first step and the etching along the modified region formed by the second step yield respective etching rates different from each other.

The line may extend along a (111) plane of the object. This forms a mirror surface on the inner face of the hole by an angle of 35° with respect to the thickness direction. The space may be a through hole opening to the front and rear faces of the object.

Advantageous Effects of Invention

The present invention can accurately form a object to be processed with a space tilted with respect to the thickness direction of the object.

BRIEF DESCRIPTION OF DRAWINGS

FIG. 7 (a) is a sectional perspective view of the object for explaining the laser processing method in accordance with a first embodiment, (b) is a sectional perspective view of the object illustrating a sequel to FIGS. 7(a), and (c) is a sectional perspective view of the object illustrating a sequel to FIG. 7(b);

FIG. 8 (a) is a sectional view of the object illustrating a sequel to FIG. 7(c), while (b) is a sectional view of the object illustrating a sequel to FIG. 8(a);

FIG. 9 (a) is a sectional perspective view of the object for explaining the laser processing method in accordance with a second embodiment, (b) is a sectional perspective view of the object illustrating a sequel to FIGS. 9(a), and (c) is a sectional perspective view of the object illustrating a sequel to FIG. 9(b);

DESCRIPTION OF EMBODIMENTS

In the following, preferred embodiments of the present invention will be explained in detail with reference to the drawings. In the following explanation, the same or equivalent constituents will be referred to with the same signs while omitting their overlapping descriptions.

The laser processing method in accordance with an embodiment converges a laser light into an object to be processed, so as to form a modified region. Therefore, the forming of the modified region will firstly be explained in the following with reference to FIGS. 1 to 6.

Figure 1:
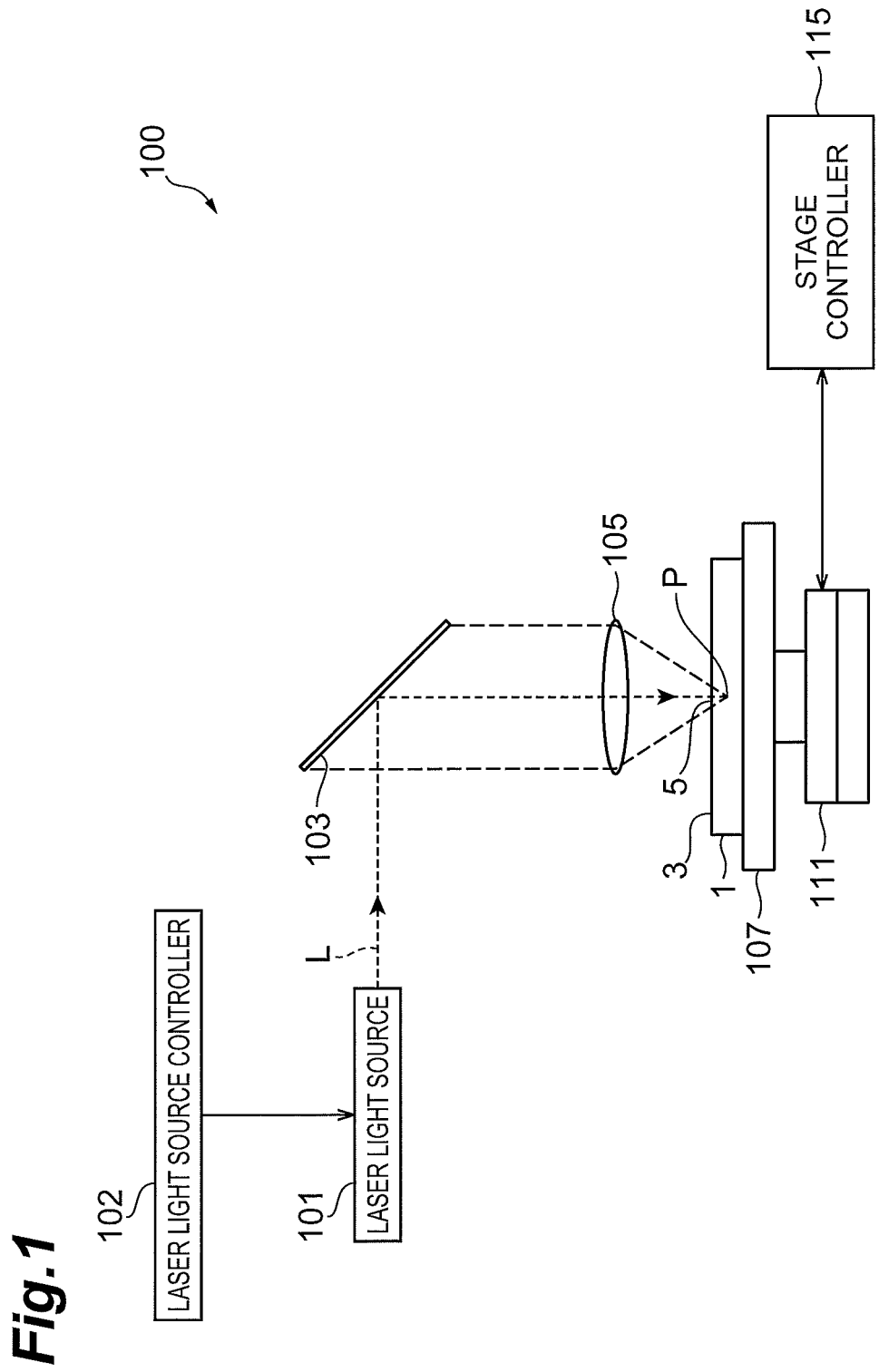
FIG. 1 is a schematic structural diagram of a laser processing device used for forming a modified region.

As illustrated in FIG. 1, a laser processing device 100 comprises a laser light source 101 which causes a laser light L to oscillate in a pulsating manner, a dichroic mirror 103 arranged such as to change the direction of the optical axis (optical path) of the laser light L by 90°, and a condenser lens 105 for converging the laser light L. The laser processing device 100 also comprises a support table 107 for supporting an object to be processed 1 irradiated with the laser light L converged by the condenser lens 105, a stage 111 for moving the support table 107, a laser light source controller 102 for controlling the laser light source 101 in order to regulate the output, pulse width, and the like of the laser light L, and a stage controller 115 for controlling the movement of the stage 111.

In the laser processing device 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a modified region forming line 5. This forms a modified region in the object 1 along the line 5.

Figure 2:
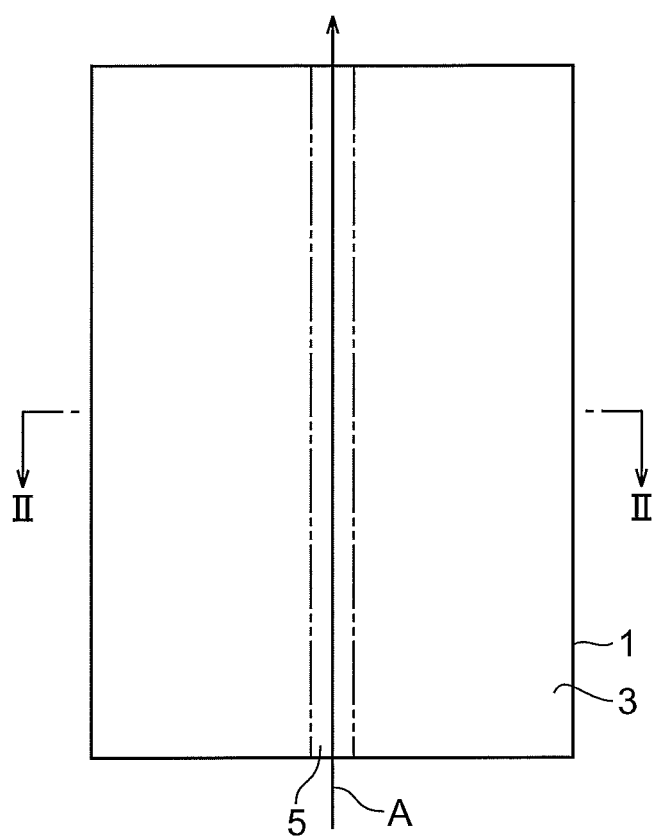
FIG. 2 is a plan view of an object to be processed in which the modified region is to be formed.
Figure 3:
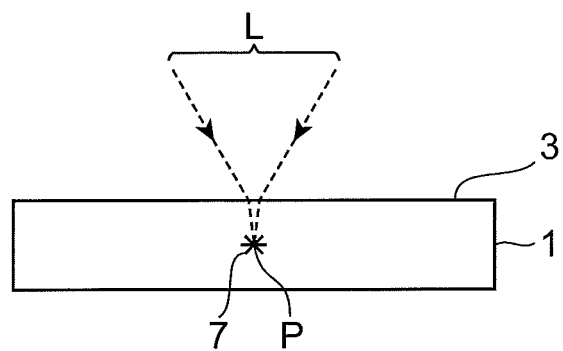
FIG. 3 is a sectional view of the object taken along the line III-III of FIG. 2.
Figure 4:
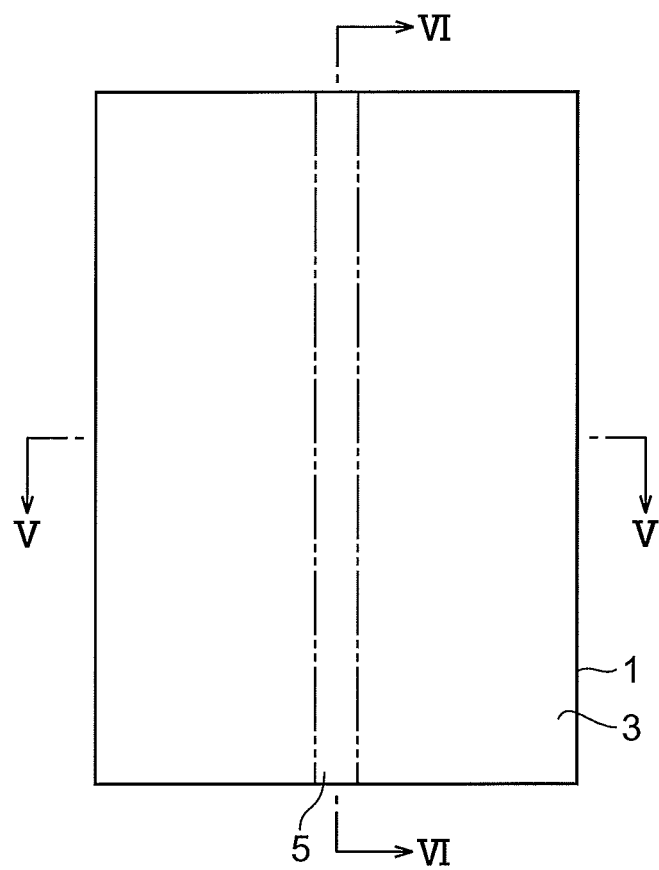
FIG. 4 is a plan view of the object after laser processing.
Figure 5:
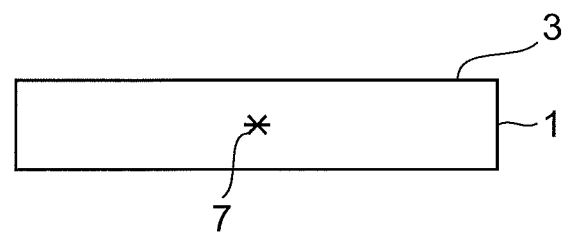
FIG. 5 is a sectional view of the object taken along the line V-V of FIG. 4.
Figure 6:
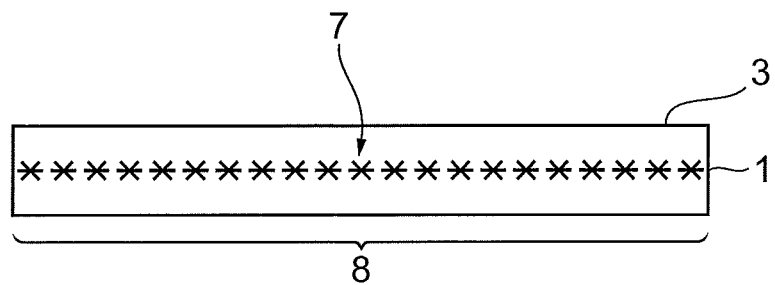
FIG. 6 is a sectional view of the object taken along the line VI-VI of FIG. 4.

As illustrated in FIG. 2, the line 5 is set in the object 1, for which a semiconductor material, a piezoelectric material, or the like is used. Here, the line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 becomes a removing region 8 to be removed by etching which will be explained later.

The converging point P is a position at which the laser light L is converged. The line 5 may be curved instead of being straight, shaped into a three-dimensional form combining them, or specified in terms of coordinates. The modified region 7 may be formed either continuously or intermittently. The modified region 7 may be formed like lines or dots. It will be sufficient if the modified region 7 is formed at least within the object 1. There are cases where fractures are formed from the modified region 7 acting as a start point, and the fractures and modified region 7 may be exposed at outer surfaces (the front face, rear face, and side faces) of the object 1.

Here, the laser light L is absorbed in particular in the vicinity of the converging point within the object 1 while being transmitted therethrough, whereby the modified region 7 is formed in the object 1 (i.e., internal absorption type laser processing). In the case of forming a removing part such as a hole or groove by melting it away from the front face 3 (surface absorption type laser processing), the processing region gradually progresses from the front face 3 side to the rear face side in general.

The modified region 7 in accordance with this embodiment means regions whose physical characteristics such as density, refractive index, and mechanical strength have attained states different from those of their surroundings. Examples of the modified region 7 include molten processed regions, crack regions, dielectric breakdown regions, refractive index changed regions, and their mixed regions. Further examples of the modified region 7 include an area where the density has changed from that of an unmodified region in a material of the object 1 and an area formed with a lattice defect (which may collectively be referred to as a high-density transitional region).

The molten processed regions, refractive index changed regions, areas where the modified region has a density different from that of the unmodified region, or areas formed with a lattice defect may further incorporate a fracture (cut or microcrack) therewithin or at an interface between the modified region 7 and an unmodified region. The incorporated fracture may be formed over the whole surface of the modified region 7 or in only a part or a plurality of parts thereof. Examples of the object 1 include those containing or constituted by silicon.

Here, this embodiment forms the modified region 7 in the object 1 and then etches the object 1, so as to advance the etching selectively along the modified region 7 (i.e., along the modified region 7, fractures included in the modified region 7, or fractures from the modified region 7), thereby removing a part extending along the modified region 7 in the object 1. These fractures are also known as cracks, microcracks, fractures, and the like (hereinafter simply referred to as "fractures").

In the etching in this embodiment, for example, a capillary action or the like is utilized so that fractures included in the modified region 7 of the object 1 or fractures from the modified region 7 are impregnated with an etchant, so as to advance the etching along fracture surfaces. This advances the etching selectively at a higher etching rate (etching speed) along the fractures in the object 1 and removes them. Also, by utilizing the characteristic feature that the etching rate of the modified region 7 itself is high, the etching is selectively advanced along the modified region 7, so as to remove it.

Examples of the etching include a case where the object 1 is immersed in the etchant (dipping) and a case where the object 1 is coated with the etchant while being rotated (spin etching).

Examples of the etchant include KOH (potassium hydroxide), TMAH (aqueous tetramethylammonium hydroxide solution), EDP (ethylenediamine pyrocatechol), NaOH (sodium hydroxide), CsOH (cesium hydroxide), $NH_4OH$ (ammonium hydroxide), and hydrazine. The etchant to be used is not limited to liquids but may be in the form of a gel (jelly or semisolid). Here, the etchant is used at a temperature ranging from ambient temperature to about 100° C., which is set appropriately according to a required etching rate or the like. When etching the object 1 made of silicon with KOH, for example, the temperature is preferably about 60° C.

As the etching, this embodiment performs anisotropic etching which is etching having a higher (or lower) etching rate in a specific direction according to a crystal orientation. The anisotropic etching is applicable not only to relatively thin objects but also to thick ones (having a thickness of 800 μm to 100 μm, for example). In this case, even when the surface to be formed with the modified region 7 differs from its plane direction, the etching can be advanced along the modified region 7. That is, the anisotropic etching here enables not only the etching of the plane direction in conformity to the crystal orientation, but also the etching independent of the crystal orientation.

First Embodiment

The laser processing method in accordance with the first embodiment will now be explained in detail. FIGS. 7 and 8 are flow diagrams for explaining this embodiment. The laser light L is a pulsed laser light in this embodiment.

This embodiment is a processing method used for manufacturing a photomultiplier or interposer, for example. In particular, as illustrated in FIGS. 7 and 8, this embodiment converges a laser light L at an object to be processed 1, so as to form a plurality of modified spots S within the object 1, while the plurality of modified spots S constitute a modified region 7. Thereafter, the part extending along the modified region 7 in the object 1 is removed by anisotropic etching, so as to form the object 1 with a through hole 24 as a tilted hole including a space extending obliquely with respect to the thickness direction of the object 1.

As illustrated in FIG. 8(b), the through hole 24 herein includes vertical parts 24a, 24a formed at respective end parts on the front face 3 side and rear face 21 side of the object 1 and a tilted part (space) 24b formed between the vertical parts 24a, 24a. Each vertical part 24a extends along the thickness direction. The tilted part 24b extends in a direction (hereinafter referred to as "tilted direction") tilted in the X direction with respect to the Z direction so as to follow a (111) plane of the object 1 while being continuous with the vertical parts 24a, 24a. The tilted part 24b forms an angle of 35°, for example, with the thickness direction (Z direction).

As depicted, the following explanation will assume the thickness direction of the object 1 (irradiation direction of the laser light L) to be the Z direction, the lateral direction to which the line 5 (through hole 24) tilts with respect to the thickness direction to be the X direction (first lateral direction), and the direction orthogonal to the X and Z directions to be the Y direction (second lateral direction).

As illustrated in FIG. 7(a), the object 1 is a silicon substrate transparent to the wavelength (e.g., 1064 nm) of the laser light L with which it is irradiated and has a front face 3 and a rear face 21 which are (100) planes. In the object 1, a modified region forming line 5 is programmably set as being specified by three-dimensional coordinates at a position corresponding to the through hole 24. Here, the line 5 includes modified region forming lines 5a extending along the thickness direction on the front face 3 side and rear face 21 side in the object 1 and a modified region forming line 5b extending between them while tilting along the (111) plane of the object 1.

First, when processing the object 1 in this embodiment, the object 1 is mounted and held on the mount table with the front face 3 facing up. Subsequently, the object 1 is irradiated with the laser light L from the front face 3 side in an on/off manner while locating a converging point of the laser light L (hereinafter simply referred to as "converging point") on the rear face 21 side within the object 1 and moving the converging point in the Y direction so as to form modified spots S along the line 5a (Y-direction scan). This converges the laser light L onto the rear face 21 side of the object 1, so as to form modified spots S exposed to the rear face 21.

Here, the modified spots S each having a width of 10 μm in the X direction are formed. The modified spots S are formed while including fractures generated therefrom (ditto in the following modified spots S). The converging point is scanned in the Y direction with a pitch (of modified spots S) of about 0.25 μm (i.e., laser irradiation is performed at intervals of 0.25 μm so as to form modified spots S by the number corresponding to that of laser irradiation operations) such that a plurality of modified spots S, each formed by a single laser irradiation operation, partly overlap each other in the Y direction.

Subsequently, the converging point is moved by a predetermined amount toward the front face 3 in the Z direction, and the above-mentioned Y-direction scan is performed such as to form modified spots S along the line 5a. This newly forms modified spots S on the front face 3 side of the existing modified spots S along the part corresponding to the vertical part 24a on the rear face 21 side of the through hole 24, so that the modified spots S or fractures therefrom are joined to each other along the line 5.

Next, as illustrated in FIG. 7(b), the converging point is moved by a predetermined amount toward the front face 3 in the Z direction and by a predetermined amount in the X direction, and then the above-mentioned Y-direction scan is performed. Specifically, the converging point is moved by predetermined amounts ΔZ and ΔX in the Z and X directions, respectively, according to the following expression (1), and then the above-mentioned Y-direction scan is performed so as to form modified spots S along the line 5b. Thereafter, the movement of the converging point and the Y-direction scan are repeated by the number of scans Ns progressively from the rear face 21 side to the front face 3 side in the object 1 according to the following expression (2):

$$\Delta Z = \Delta X / \tan \theta \quad (1)$$

$$Ns = T/\Delta Z \quad (2)$$

where ΔX=a predetermined value (e.g., 3 μm), θ=the angle formed by the line 5 and the Z direction, and T=the thickness of the tilted part 24b in the Z direction.

This continuously forms a plurality of modified spots S such that the modified spots adjacent to each other partly overlap each other when seen in the X direction. Specifically, a plurality of modified spots S are formed like stairsteps along the line 5b while being shifted in the thickness direction such that the modified spots S adjacent to each other partly overlap each other when seen in the X direction, and the modified spots S or fractures from the modified spots S are joined to each other along the line 5.

Next, as illustrated in FIG. 7(c), the converging point is moved by a predetermined amount toward the front face 3 in the Z direction, and the above-mentioned Y-direction scan is performed such as to form modified spots S along the line 5a. This newly forms modified spots S exposed to the front face 3 while being continuous with the existing modified spots S on the front face 3 side thereof, so that the modified spots S or fractures therefrom are joined to each other along the line 5. The foregoing forms a plurality of modified spots S continuous with each other in the part corresponding to the through hole 24 in the object 1, thereby producing a modified region 7A.

Afterward, the object 1 is anisotropically etched with KOH at 85° C., for example, employed as an etchant. This lets the etchant proceed and infiltrate from the front face 3 and rear face 21 into the modified region 7 in the object 1 as illustrated in FIG. 8(a), so as to advance (develop) the etching along the modified region 7 from the front face 3 side and rear face 21 side to the inside. As a result, the part extending along the modified region 7 in the object 1 is removed as illustrated in FIG. 8(b), whereby the forming of the through hole 24 is completed.

Here, by utilizing the characteristic feature that the etching rate depends on the crystal orientation of the object 1, the selective advancement of etching along the modified region can favorably be controlled in the anisotropic etching for the object 1. That is, in the (111) plane in the object 1, the etching rate is much lower than in the other parts, whereby the etch stops. Hence, in the modified region 7 extending along the (111) plane (i.e., the modified region 7 corresponding to the tilted part 24b), etching advances selectively at a high speed in particular along the extending direction, while the inner face of the resulting tilted part 24b is devoid of its corners and becomes smoother, so that a mirror surface is formed on the inner face.

Here, in the modified region 7 extending along the line 5b, the modified spots S, S adjacent to each other at least partly overlap each other when seen in the X direction as mentioned above, whereby the modified spots S or fractures therefrom can favorably be joined to each other along the line 5b. Therefore, the selective etching of the modified region 7 can favorably be advanced without interruption even when proceeding in the tilted direction.

In particular, in the modified region 7 extending along the line 5b in this embodiment, a plurality of modified spots S are formed while being shifted in the thickness direction such that the modified spots S adjacent to each other partly overlap each other when seen in the X direction as mentioned above, whereby the modified spots S or fractures therefrom densely join with each other along the line 5b, for example, so that the etchant infiltrates and proceeds between the modified spots S, S without retention, thereby advancing the etching reliably at a high speed in the tilted direction without interruption.

Therefore, this embodiment can accurately remove the part corresponding to the through hole 24 in the object 1, whereby the through hole 24 can be formed precisely in the object 1. Also, the through hole 24 having desirable angle and length can be formed easily, whereby the degree of freedom in processing the object 1 can be improved.

As mentioned above, the line 5b extends along the (111) plane of the object, while the modified spots S in the part corresponding to the tilted part 24b of the through hole 24 in the object 1 are formed along the (111) plane of the object. This can form a mirror surface, which is a smooth surface with less depressions and projections, on the inner face of the tilted part 24b and allows the tilted part 24b to have a rectangular (diamond-shaped) cross section.

Though this embodiment exposes the modified spots S to the front face 3 and rear face 21, fractures from the modified spots S may be exposed instead of the modified spots S. Exposing the modifies spots S to the front face 3 and rear face 21 can increase the aperture ratio of the resulting through hole 24, so as to enhance the efficiency in collecting electrons when employing this embodiment in a photomultiplier, for example. On the other hand, exposing fractures instead of the modified spots S can restrain the through hole 24 from increasing its size on the opening side, whereby the pore size of the through hole 24 on the opening side can be the same as that on the inside thereof.

The number of modified spots S formed in the object 1, i.e., the number of operations of irradiation with the laser light L (shots), is not limited to that in this embodiment, but may be set as appropriate according to the form (such as the pore size, length, and angle with respect to the Z direction) of the through hole 24.

Second Embodiment

The second embodiment will now be explained. This embodiment will mainly be explained in terms of differences from the above-mentioned first embodiment. The laser light L is a pulsed laser light as in the above-mentioned first embodiment.

FIG. 9 is a flow diagram for explaining this embodiment. First, as illustrated in FIG. 9(a), this embodiment irradiates the object 1 with the laser light L in an on/off manner from the front face 3 side, while locating the converging point on the rear face 21 side of the object 1 and moving the converging point along the X direction such as to form modified spots S on the line 5a (X-direction scan). This forms two or more modified spots S continuously aligning along the X direction as a modified spot group 10 exposed to the rear face 21 on the rear face 21 side of the object 1.

In the modified spot group 10 herein, the interval between the modified spots S aligning in a row is 0.25 μm, while the modified spots S partly overlap each other in the X direction (ditto in the following). Specifically, the converging point is scanned in the X direction with a pitch (of modified spots S) of about 0.25 μm (i.e., laser irradiation is performed at intervals of 0.25 μm so as to form modified spots S by the number corresponding to that of laser irradiation operations), whereby the modified spot group 10 is formed such that the modified spots S, each formed by a single laser irradiation operation, partly overlap each other in the X direction.

Subsequently, the converging point is moved by a predetermined amount toward the front face 3 in the Z direction, and the above-mentioned X-direction scan is performed such as to form a modified spot group 10 along the line 5a. This newly forms a modified spot group 10 on the front face 3 side of the existing modified spot group 10 along the part corresponding to the vertical part 24a on the rear face 21 side of the through hole 24, so that the modified spots S or fractures therefrom are joined to each other along the line 5.

Next, as illustrated in FIG. 9(b), the converging point is moved toward the front face 3 in the Z direction, and the above-mentioned X-direction scan is performed such that a modified spot group 10 is formed along the line 5b. Then, the movement of the converging point in the Z direction and the X-direction scan are repeatedly performed a plurality of times progressively from the rear face 21 side to the front face 3 side in the object 1. This forms a plurality of modified spot groups 10 along the part corresponding to the tilted part 24b of the through hole 24. Specifically, a plurality of modified spot groups 10 are formed along the line 5b while being shifted in the X direction such that a pair of modified spot groups 10, 10 adjacent to each other partly overlap each other when seen in the Z direction, so that the modified spots S or fractures therefrom are joined to each other along the line 5.

At this time, for favorably performing anisotropic etching in a later stage, the overlap between the adjacent modified spot groups 10 when seen in the Z direction is set according to the pore size of the tilted part 24b to be formed and the angle of the tilted part 24b (line 5b) with respect to the Z direction. Here, the adjacent modified spot groups 10 are formed such as to overlap each other by about 8 to 10 µm in the X direction.

Subsequently, as illustrated in FIG. 9(c), the converging point is moved toward the front face 3 in the Z direction, and the above-mentioned scan in the X direction is performed such as to form modified spots S along the line 5a. This newly forms a modified spot group 10 exposed to the front face 3 on the front face side of the existing modified spot group 10 along the part corresponding to the vertical part 24a on the front face 3 side, so that the modified spots S or fractures therefrom are joined to each other along the line 5. The foregoing forms the modified spot groups 10, each comprising a plurality of modified spots S, continuous with each other in the part corresponding to the through hole 24 of the object 1, thereby producing a modified region 7B.

As in the foregoing, this embodiment is also effective in accurately removing the part corresponding to the through hole 24 in the object 1 and precisely forming the through hole 24 in the object 1, which is similar to the effect mentioned above.

As mentioned above, this embodiment forms a plurality of modified spot groups 10 along the line 5b while shifting them in the X direction such that a pair of modified spot groups 10 adjacent to each other partly overlap each other when seen in the X direction. Therefore, in the modified region 7 extending along the line 5b, for example, the modified spots S and fractures densely join with each other along the line 5b, so that the etchant infiltrates and proceeds without retention even when selective etching advances in the tilted direction. Hence, the selective etching advances reliably at a high speed in the tilted direction without interruption. As a result, the part corresponding to the tilted part 24b of the through hole 24 can be removed accurately, whereby the through hole 24 can be formed precisely.

As mentioned above, this embodiment forms the modified region 7B by performing the X-direction scan, i.e., irradiation with the laser light L with its converging point L moving along the X-direction, and thus can suppress wasted movement of the converging point of the laser light L (the number of scans), so as to enable faster processing, thereby improving the takt time. Also, the modified region 7B can be formed by the same number of scans without depending on the length of the through hole 24 and its angle with respect to the thickness direction.

The width of each modified spot group 10 in the X direction and the number of modified spots S therein (i.e., the number of operations of irradiation with the laser light L) are not limited, but can be set as appropriate according to the form of the through hole 24. This will also hold in the following embodiments.

Third Embodiment

The third embodiment will now be explained. This embodiment will mainly be explained in terms of differences from the above-mentioned first embodiment. The laser light L is a pulsed laser light as in the above-mentioned first embodiment.

Figure 10:
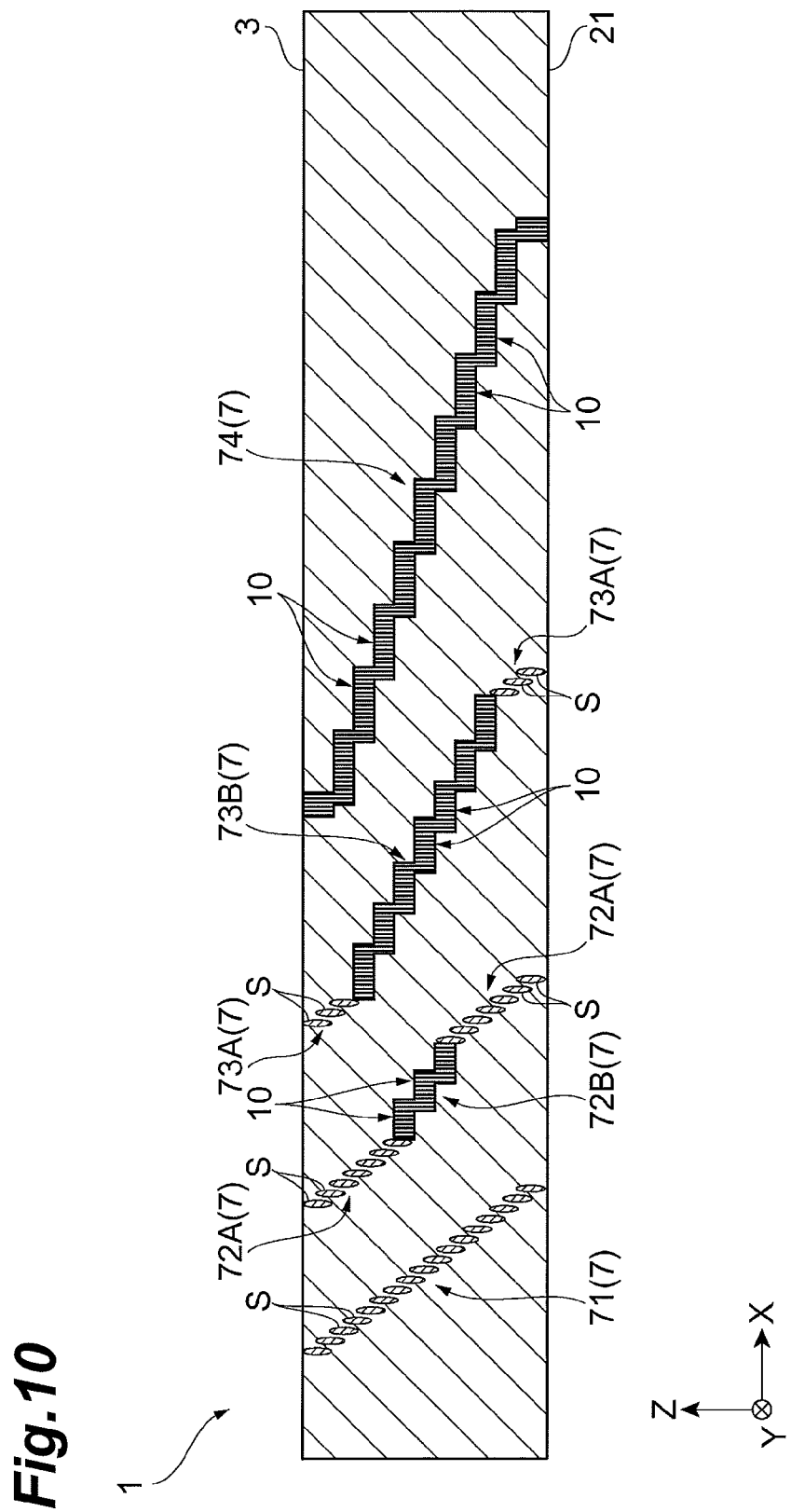
FIG. 10 is a sectional view of the object for explaining the laser processing method in accordance with a third embodiment.
Figure 11:
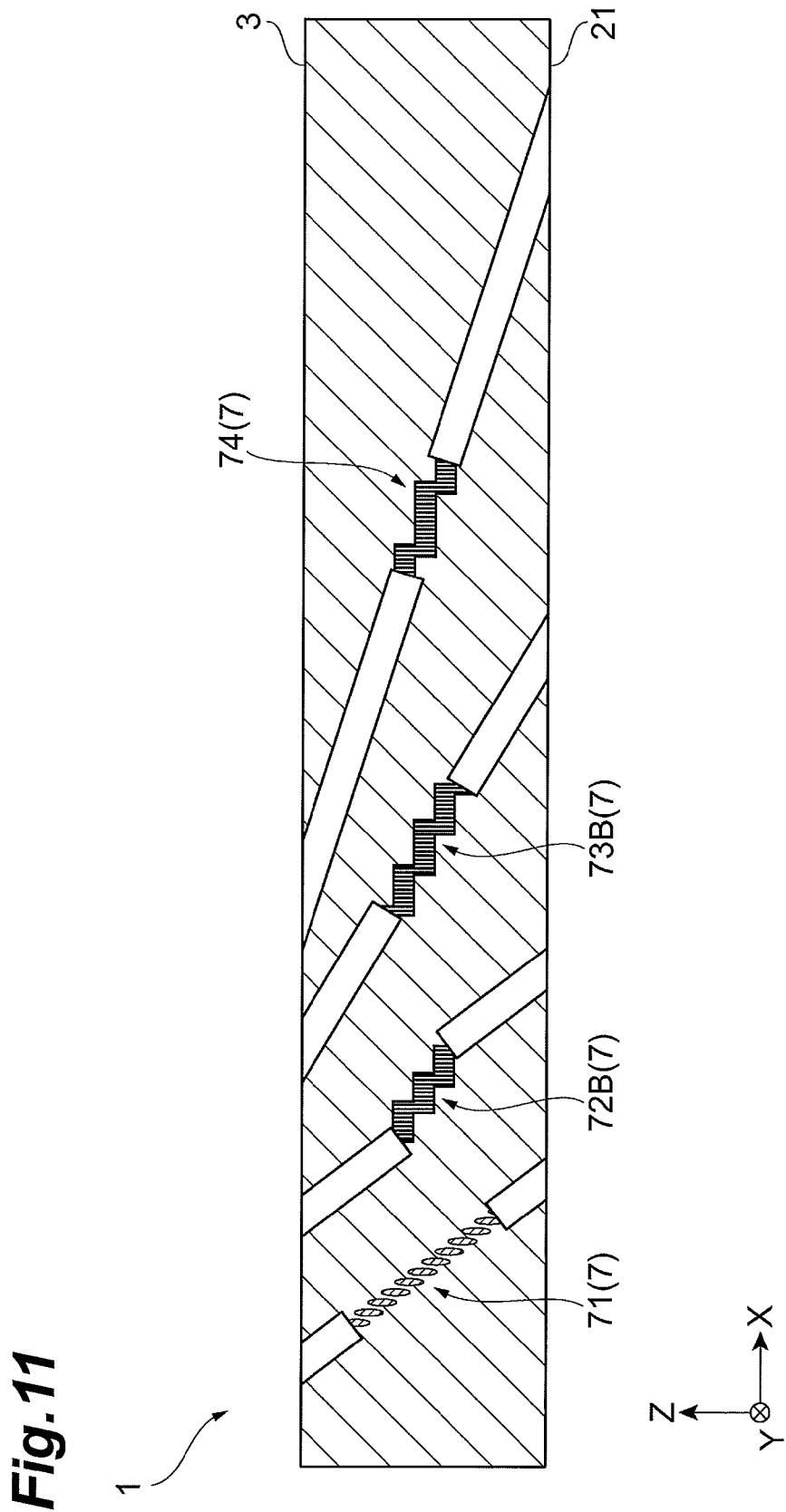
FIG. 11 is a sectional view of the object illustrating a sequel to FIG. 10.
Figure 12:
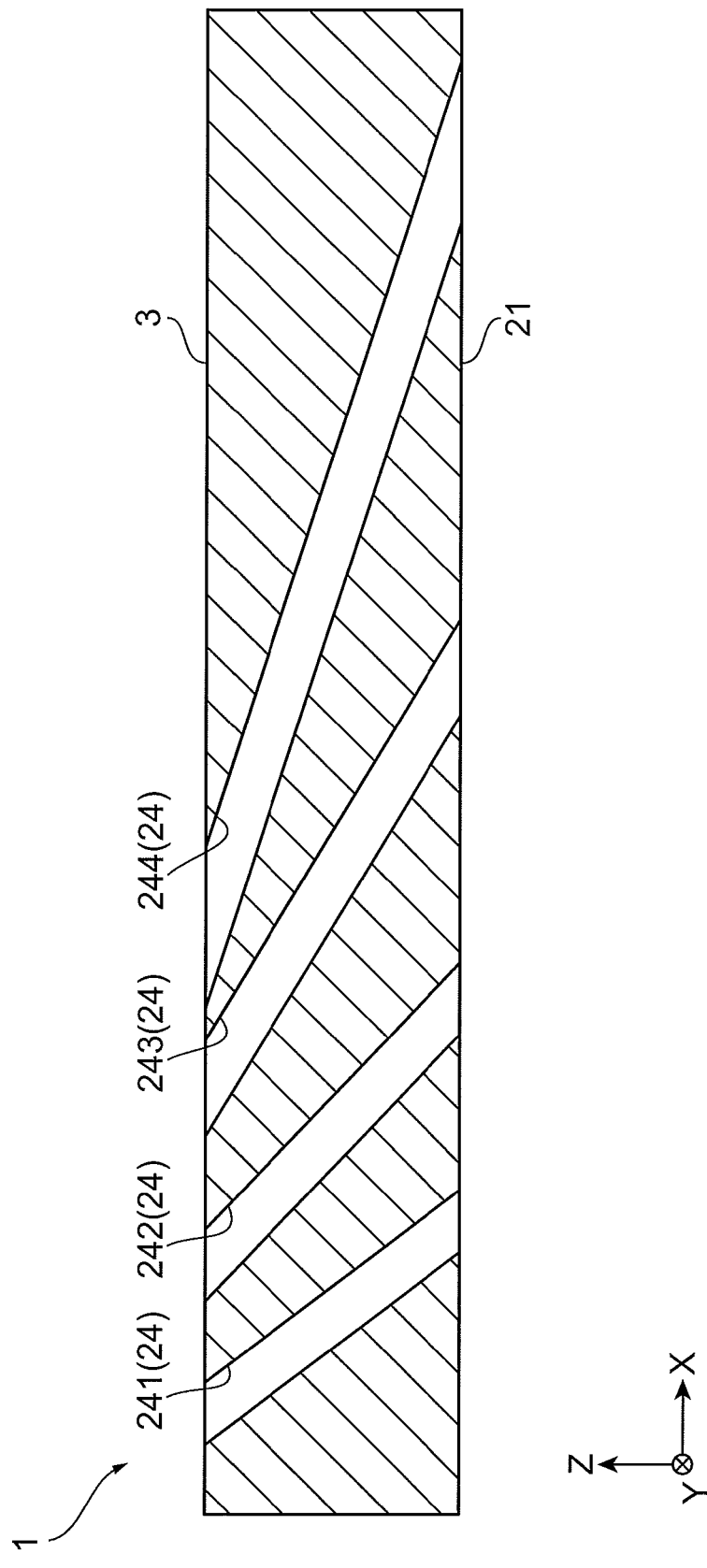
FIG. 12 is a sectional view of the object illustrating a sequel to FIG. 11.

FIGS. 10 to 12 are flow diagrams for explaining this embodiment. As illustrated in FIG. 12, this embodiment forms the object 1 with a plurality of through holes (spaces) 241 to 244 extending obliquely with respect to the Z direction. The through holes 241 to 244 tilt more with respect to the Z direction and extend longer in this order.

As illustrated in FIG. 10, this embodiment performs the Y-direction scan in the first embodiment and the X-direction scan in the second embodiment as appropriate according to the respective lengths by which the through holes 241 to 244 extend as follows, so as to form modified regions 7. That is, as illustrated in FIGS. 10 and 12, the Z-direction movement of the converging point and the Y-direction scan are repeatedly performed a plurality of times, so as to form a modified region 71 extending along the part corresponding to the through hole 241, modified regions 72A, 72A extending along the parts corresponding to the respective end parts on the front face 3 side and rear face 21 side of the through hole 242, and modified regions 73A, 73A extending along the parts corresponding to the respective vicinities of the front face 3 and rear face 21 of the through hole 243.

In each of the modified regions 71, 72A, 73A, a plurality of modified spots S are formed while being shifted in the thickness direction such that the modified spots S adjacent to each other partly overlap each other when seen in the X direction. Here, the modified region 72A extends longer than the modified region 73A.

Also, the Z-direction movement of the converging point and the X-direction scan are repeatedly performed a plurality of times, so as to form a modified region 72B extending along the part corresponding to the center part of the through hole 242 in the Z direction, a modified region 73B extending along the part corresponding to the space between the respective vicinities of the front face 3 and rear face 21 of the through hole 243, and a modified region 74 extending along the part corresponding to the though hole 244.

In each of the modified regions 72B, 73B, 74, a plurality of modified spot groups 10 are formed while being shifted in the X-direction such that the modified spot groups 10, 10 adjacent to each other partly overlap each other when seen in the Z direction. Here, the modified region 73B extends longer than the modified region 72B.

Next, as illustrated in FIGS. 11 and 12, the object 1 is anisotropically etched, so that the etchant proceeds and infiltrates from the front face 3 and rear face 21 into the modified regions 7 in the object 1, thereby selectively advancing the etching along the modified regions 7.

Here, a characteristic feature is found in that the etching along the modified regions 71, 72A, 73A formed by the Y-direction scan and the etching along the modified regions 72B, 73B, 74 formed by the X-direction scan yield respective etching rates different from each other. Specifically, as the characteristic feature, it is found that the etching rate in the etching along the modified regions 72B, 73B, 74 is higher than that in the etching along the modified regions 71, 72A, 73A depending on how the modified spots S or fractures join with each other and so forth, for example.

Hence, as illustrated in FIG. 11, in the anisotropic etching in this embodiment, the etching advances faster along the modified regions 72B, 73B, 74 than along the modified regions 71, 72A, 73A. That is, the etching advances such that the through holes 241 to 244 are formed at higher etching rate as their extending length is longer. This adjusts the time required for completing the etching (i.e., boring the through holes 241 to 244), so as to finish forming the through holes 241 to 244 substantially at the same time such that they have the same pore size as illustrated in FIG. 12.

As in the foregoing, this embodiment is also effective in accurately removing the parts corresponding to the through holes 241 to 244 in the object 1 and precisely forming the through holes 241 to 244 in the object 1, which is similar to the effect mentioned above.

In general, a plurality of through holes 241 to 244 extending by lengths different from each other require different times for completing etching and thus are hard to attain the same pore size. In this regard, this embodiment performs laser processing combining the X-direction scan and Y-direction scan as mentioned above, so as to form the modified regions 72B, 73B, 74 with higher etching rates and the modified regions 71, 72A, 73A with lower etching rates for their corresponding through holes 241 to 244. This can adjust the times required for completing etching in the through holes 241 to 244, thereby controlling their pore sizes as desired.

In particular, as mentioned above, this embodiment forms the modified regions 7 with higher etching rates larger (the modified regions 7 with lower etching rates smaller) in parts corresponding to the through holes 241 to 244 extending longer, so that they require the same time for completing the etching. This can make the through holes 241 to 244 have the same pore size.

Though preferred embodiments of the present invention have been explained in the foregoing, the present invention is not limited thereto but may be modified or applied to others within the scope not changing the gist recited in each claim.

For example, the laser light entrance surface for forming the modified regions 7 is not limited to the front face 3 of the object 1, but may be the rear face 21 of the object 1. Though the above-mentioned embodiments form the through holes 24 in the object 1, blind holes opening to the front face 3 or rear face 21 alone may be formed instead. Channels and slits may be formed as well. It will be sufficient if a space extending in a direction tilted with respect to the Z direction is formed. The above-mentioned embodiments can produce through holes 24 having various forms of cross sections such as circular, elliptical, and polygonal forms.

Though the above-mentioned embodiment tilts the tilted part 24b of the through hole by 35° (the azimuth angle of the (111) plane) with respect to the Z direction, the tilted angle is not limited thereto, but may be 10° or 45°. In this case, multiple steps (staircase structure) can be formed on the inner face of the tilted part 24b.

Since doping the etchant with additives can change the etching rate in a specific crystal orientation, the etchant may be doped with an additive corresponding to the crystal orientation of the object 1 in order to perform anisotropic etching at a desirable etching rate.

INDUSTRIAL APPLICABILITY

The present invention can accurately form an object to be processed with a space extending in a direction tilted with respect to the thickness direction of the object.

REFERENCE SIGNS LIST

1 . . . object; 3 . . . front face; 5b . . . modified region forming line; 7, 7A, 7B, 71, 72A, 72B, 73A, 73B, 74 . . . modified region; 10 . . . modified spot group; 21 . . . rear face; 24b . . . tilted part (space) of a through hole; 241 to 244 . . . through hole (space); L . . . laser light; S . . . modified spot

The invention claimed is:

1. A laser processing method comprising:
a modified region forming step of converging a laser light at a sheet-like object to be processed made of silicon so as to form a plurality of modified spots within the object along a modified region forming line tilted in a first lateral direction as compared to a thickness direction of the object, the modified region forming step including,
(i) irradiating the object with the laser light while moving the laser light along a second lateral direction to form a plurality of modified spots along the second lateral direction, the second lateral direction being perpendicular to the first lateral direction, the plurality of modified spots overlapping each other in the second lateral direction to form a group of overlapping modified spots that extends in the second lateral direction,
(ii) moving a converging point of the laser light along the first lateral direction and the thickness direction, and
(iii) repeating steps (i) and (ii) so as to form a plurality of groups of overlapping modified spots along the modified region forming line, each group of overlapping modified spots also partially overlapping each other when viewed from the first lateral direction, and the plurality of groups of overlapping modified spots defining a modified region; and
an etching step of anisotropically etching the object after the modified region forming step so as to advance the etching selectively along the modified region and form the object with a space extending obliquely as compared to the thickness direction.

2. A laser processing method according to claim 1, wherein the line extends along a (111) plane of the object.

3. A laser processing method according to claim 1, wherein the space is a through hole opening to the front and rear faces of the object.

4. A laser processing method according to claim 1, wherein the step (iii) is performed such that each group of overlapping modified spots do not overlap with each other when viewed from the second lateral direction.

5. A laser processing method according to claim 1, wherein the step (i) is formed such that the group of overlapping modified spots forms a contiguous structure.

6. A laser processing method comprising:
a modified region forming step of converging a laser light at a sheet-like object to be processed made of silicon so as to form a plurality of modified spots within the object along a modified region forming line tilted in a first lateral direction as compared to a thickness direction of the object, the modified region forming step including,
(i) irradiating the object with the laser light while moving the laser light along the first lateral direction to form a plurality of modified spots along the first lateral direction, the plurality of modified spots overlapping each other in the first lateral direction to form a group of overlapping modified spots that extends in the first lateral direction,
(ii) moving a converging point of the laser light along the first lateral direction and the thickness direction, and
(iii) repeating steps (i) and (ii) so as to form a plurality of groups of overlapping modified spots along the modified region forming line, each of the groups of overlapping modified spots also partially overlapping each other when viewed form the thickness direction, the plurality of groups of overlapping modified spots defining a modified region; and an etching step of anisotropically etching the object after the modified region forming step so as to advance the etching selectively along the modified region and form the object with a space extending obliquely as compared to the thickness direction.

7. A laser processing method according to claim 6, wherein the line extends along a (111) plane of the object.

8. A laser processing method according to claim 6, wherein the space is a through hole opening to the front and rear faces of the object.

9. A laser processing method according to claim 6, wherein the step (i) is formed such that the group of overlapping modified spots forms a contiguous structure.

* * * * *